United States Patent
Lin et al.

(10) Patent No.: US 7,169,665 B2
(45) Date of Patent: Jan. 30, 2007

(54) CAPACITANCE PROCESS BY USING PASSIVATION FILM SCHEME

(75) Inventors: Chuan Chang Lin, Hsinchu (TW); James Chiu, Hsin-Chu (TW)

(73) Assignee: Tawian Semiconductor Manufacturing Company, Ltd. (TW)

( * ) Notice: Subject to any disclaimer, the term of this patent is extended or adjusted under 35 U.S.C. 154(b) by 0 days.

(21) Appl. No.: 10/838,674

(22) Filed: May 4, 2004

(65) Prior Publication Data

US 2005/0250280 A1  Nov. 10, 2005

(51) Int. Cl.
*H01L 21/8242* (2006.01)

(52) U.S. Cl. ............... 438/253; 438/239; 438/254; 438/396; 438/397

(58) Field of Classification Search ........... 438/239, 438/253, 254, 396, 397, FOR. 220, FOR. 430
See application file for complete search history.

(56) References Cited

U.S. PATENT DOCUMENTS

| | | | |
|---|---|---|---|
| 5,789,303 A | 8/1998 | Leung et al. | |
| 5,812,364 A * | 9/1998 | Oku et al. | 361/312 |
| 5,898,200 A | 4/1999 | Sugiyama et al. | |
| 5,918,135 A * | 6/1999 | Lee et al. | 438/393 |
| 6,143,601 A * | 11/2000 | Sun | 438/253 |
| 6,259,128 B1 * | 7/2001 | Adler et al. | 257/301 |
| 6,329,234 B1 | 12/2001 | Ma et al. | |
| 6,384,442 B1 | 5/2002 | Chen | |
| 2002/0192919 A1 * | 12/2002 | Bothra | 438/381 |
| 2005/0212021 A1 * | 9/2005 | Tu et al. | 257/296 |

* cited by examiner

*Primary Examiner*—George R. Fourson
*Assistant Examiner*—Joannie Adelle Garcia

(57) ABSTRACT

In accordance with the objectives of the invention a new method and structure is provided for the creation of a capacitor. A contact pad and a lower capacitor plate have been provided over a substrate. Under the first embodiment of the invention, a layer of etch stop material, serving as the capacitor dielectric is deposited after which a triple layer of passivation is created over a substrate. The compound passivation layer is first etched, using a fuse mask, to define and expose the capacitor dielectric and a fuse area after which the passivation layer is second etched to define and expose the contact pad. A layer of AlCu is then deposited, patterned and etched to create a capacitor upper plate and a contact interconnect over the contact pad. Under a second embodiment of the invention, a triple layer of passivation is created over a layer of etch stop material deposited over a substrate, a contact pad and a lower capacitor plate have been provided over the substrate. The compound passivation layer is first etched to expose the lower capacitor plate. A layer of capacitor dielectric is deposited after which the passivation layer is second etched to expose the contact pad. A layer of AlCu is then deposited, patterned and etched to create an AlCu interconnect over the contact pad and a upper capacitor plate.

20 Claims, 6 Drawing Sheets

CAPACITANCE PROCESS BY USING PASSIVATION FILM SCHEME

BACKGROUND OF THE INVENTION

(1) Field of the Invention

The invention relates to the fabrication of integrated circuit devices, and more particularly, to a structure and a simplified method for the creation of a MIM capacitor.

(2) Description of the Prior Art

The manufacturing of semiconductor devices applies a number of interacting disciplines that collectively create high performance semiconductor devices. The majority of these semiconductor devices have as function the processing of digital information, which is characterized by zero and one conditions, typically created by on-off conditions of switching transistors. In addition, hybrid functions can be provided that address not only the processing of digital signals but also address the processing of analog signals, either as a function provided by an analog semiconductor device or in collaboration with digital devices.

Device performance improvements have been sought and established by continuously decreasing device dimensions, thereby concurrently increasing device packaging density. This poses problems for a number of the typical analog components such as capacitors and inductors, which have physical dimensions that do not lend themselves to ready integration into a highly miniaturized, sub-micron device environment.

Continued reduction in device dimensions has placed increased emphasis on using copper as an interconnect material. The limitation that this approach experiences however is that the technology of creating capacitive components in a copper interconnect environment as yet presents a challenge, especially where this interconnect environment makes use of the copper damascene process.

Low resistivity metals such as aluminum and copper and their binary and ternary alloys have been widely explored as interconnects in semiconductor manufacturing. Typical examples of interconnect metals include $Al_xCu_y$, ternary alloys and other similar low resistivity metal-based alloys. Emphasis on scaling down line width dimensions in very large scale integrated (VLSI) circuitry manufacturing has led to reliability problems including inadequate isolation, electromigration and planarization. Damascene processes use metal filling of vias and lines followed by chemical mechanical polishing (CMP) of Al, Cu and Cu-based alloys, which are key elements of future wiring technologies for very large-scale system integration (VLSI) and ultra-large scale integration (ULSI).

The creation of a capacitor typically requires a complex and time-consuming sequence of processing steps, resulting in a relatively expensive component. The invention addresses this aspect of the creation of a capacitor and provides a simple, low cost process.

U.S. Pat. No. 6,384,442 B1(Chen) shows a MIM Capacitor process.

U.S. Pat. No. 6,329,234 B1(Ma et al.) reveals a copper compatible MIM capacitor method.

U.S. Pat. No. 5,898,200(Sugiyama et al.) shows a capacitor and passivation layer arrangement.

U.S. Pat. No. 5,789,303(Leung et al.) shows cap over a passivation layer.

SUMMARY OF THE INVENTION

A principal objective of the invention is to provide a low-cost method of creating a Metal-Insulation-Metal (MIM) capacitor.

In accordance with the objectives of the invention a new method and structure is provided for the creation of a capacitor. A contact pad and a lower capacitor plate have been provided over a substrate. Under the first embodiment of the invention, a layer of etch stop material, serving as the capacitor dielectric is deposited after which a triple layer of passivation is created over a substrate. The compound passivation layer is first etched, using a fuse mask, to define and expose the capacitor dielectric and a fuse area after which the passivation layer is second etched to define and expose the contact pad. A layer of AlCu is then deposited, patterned and etched to create a capacitor upper plate and a contact interconnect over the contact pad. Under a second embodiment of the invention, a triple layer of passivation is created prior to forming a layer of etch stop material deposited over a substrate, a contact pad and a lower capacitor plate have been provided over the substrate. The compound passivation layer is first etched to expose the lower capacitor plate. A layer of capacitor dielectric is deposited after which the passivation layer is second etched to expose the contact pad. A layer of AlCu is then deposited, patterned and etched to create an AlCu interconnect over the contact pad and an upper capacitor plate.

BRIEF DESCRIPTION OF THE DRAWINGS

FIG. 1 shows the cross section of a substrate, a contact pad area and a capacitor lower plate have been defined in the substrate, underlying metal interconnects are shown.

FIG. 2 shows a cross section after patterning for the pad area; a layer of etch stop and a compound passivation layer have been deposited, a first exposure mask has been created for patterning of a fuse area and exposure of the capacitor dielectric.

FIG. 3 shows a cross section after the fuse has been etched and the capacitor dielectric have been exposed.

FIG. 4 shows a cross section after creation of a second etch resist mask for exposure of the contact pad.

FIG. 5 shows a cross section after the contact pad has been exposed, a layer of metal has been deposited and a third etch resist mask has been created for removal of excess metal.

FIG. 6 shows the cross section of the completed structure of the first embodiment of the invention, the fuse has been exposed, a metal interconnect has been created over the contact pad and an upper capacitor plate has been created.

Figure 7:
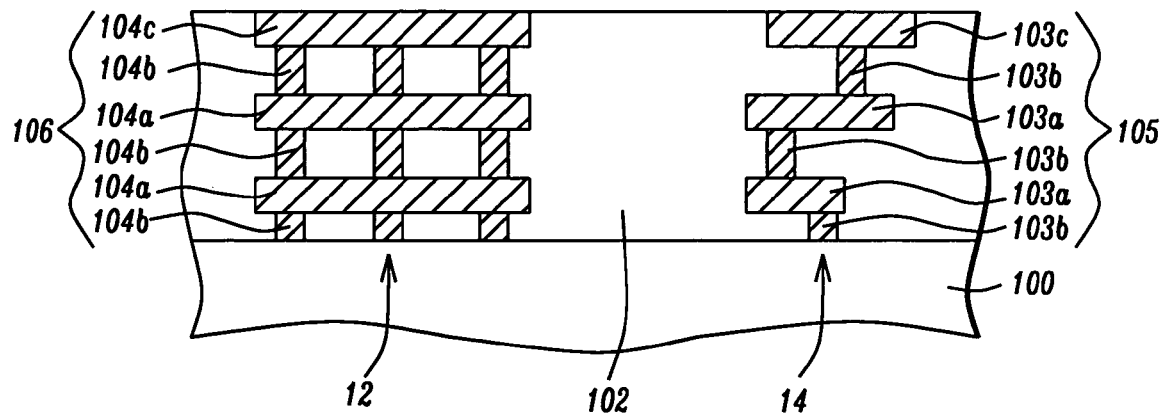

The second embodiment of the invention is explained using FIGS. 7 through 12, as follows:

FIG. 7 shows the cross section of a substrate, a contact pad and a capacitor lower plate have been provided in the substrate, a passivation layer has been deposited, underlying layers of interconnect are shown.

Figure 8:
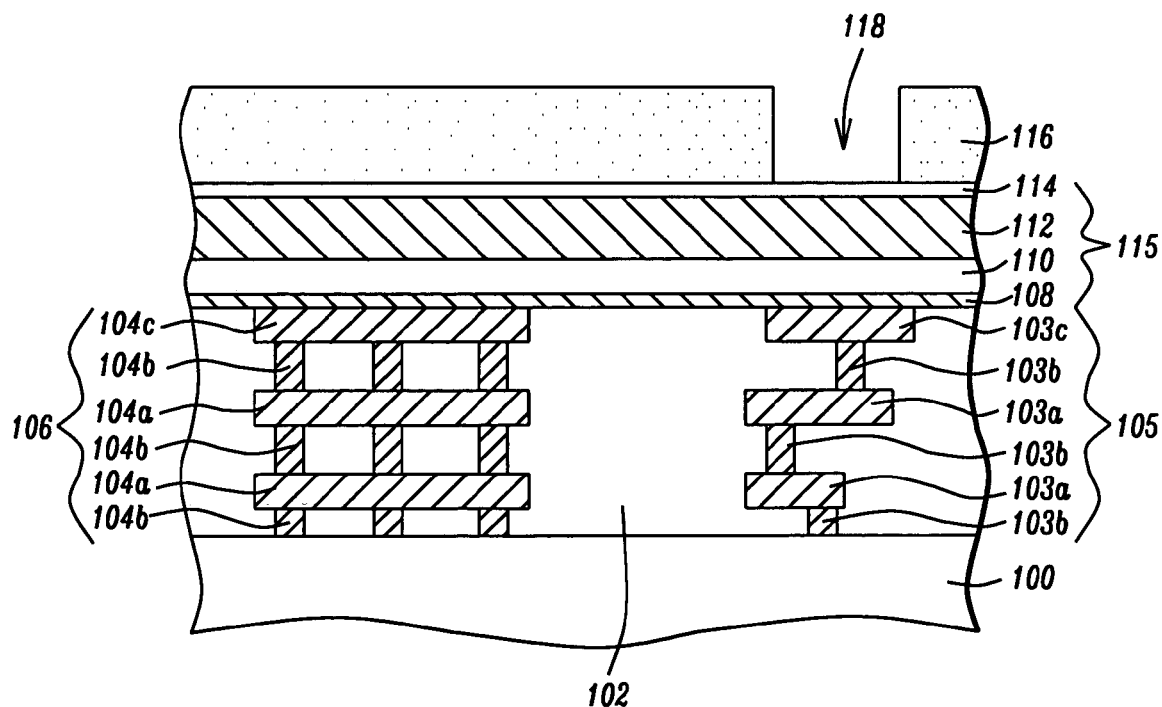

FIG. 8 shows the cross section after a layer of etch stop material has been deposited, a compound layer of passivation has been deposited and patterned for exposure of the capacitor lower plate.

Figure 9:
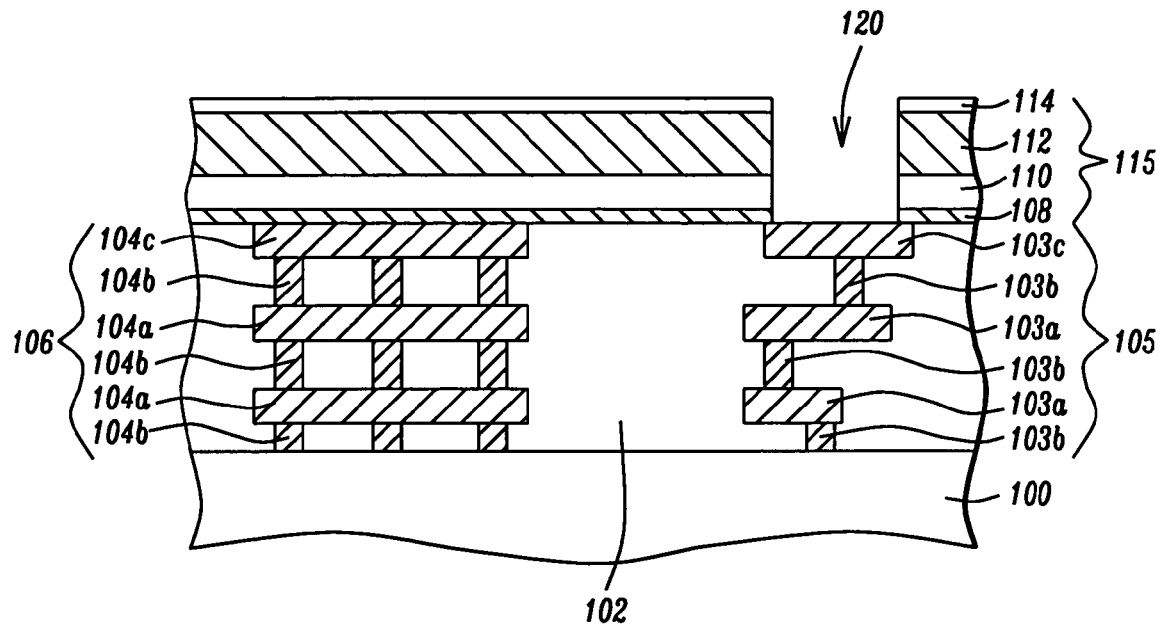

FIG. 9 shows the cross section after the lower plate of the capacitor has been exposed.

Figure 10:
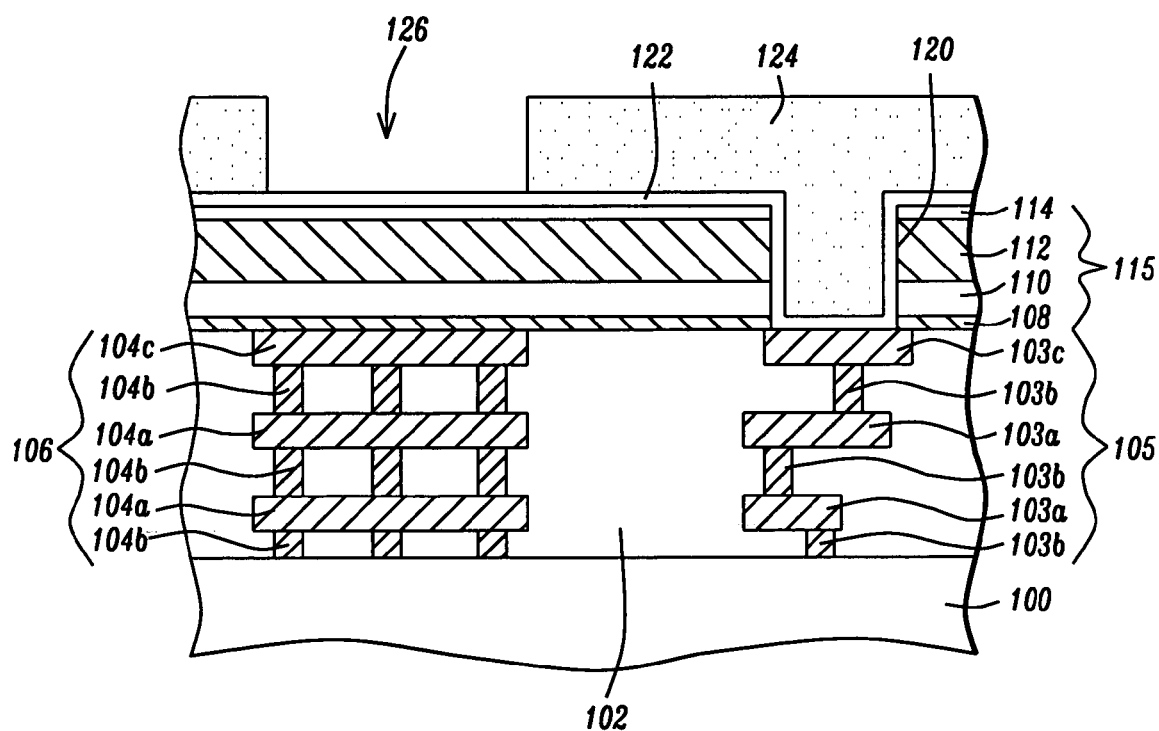

FIG. 10 shows a cross section after a layer of capacitor dielectric has been deposited and after a fifth photoresist mask has been created for exposure of the contact pad.

Figure 11:
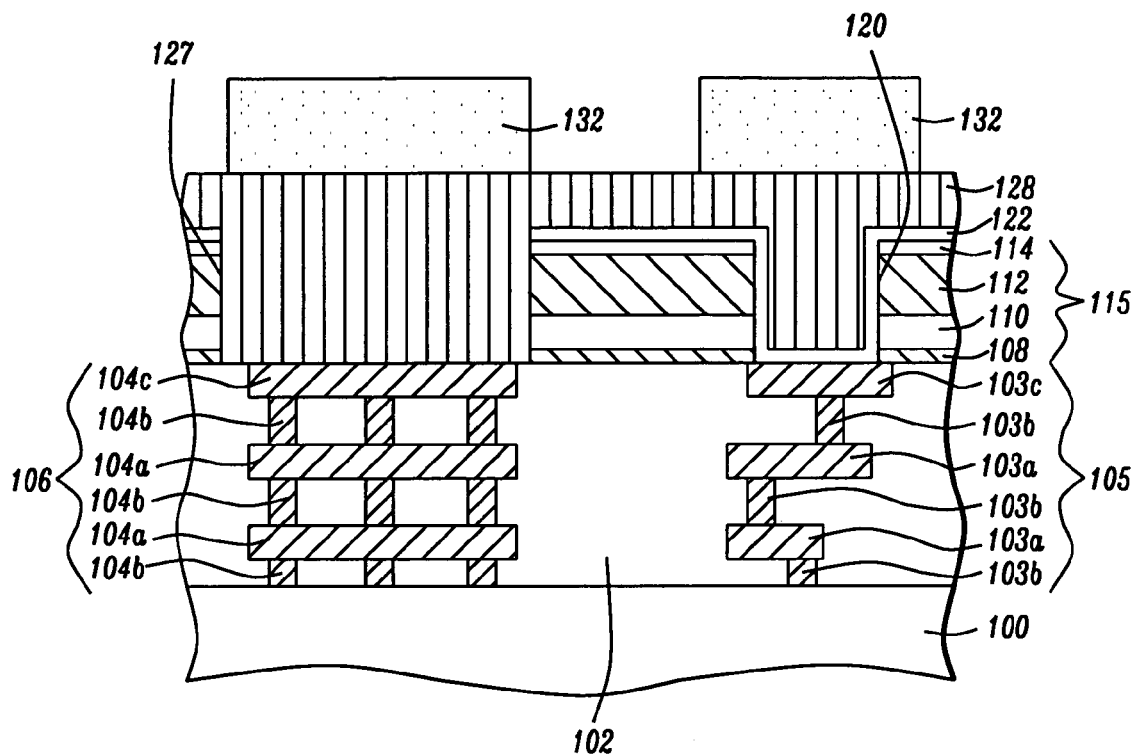

FIG. 11 shows a cross section after the contact pad has been exposed, a layer of metal, such as a layer of AlCu, has been deposited, a sixth exposure mask has been created for the removal of excess metal.

Figure 12:
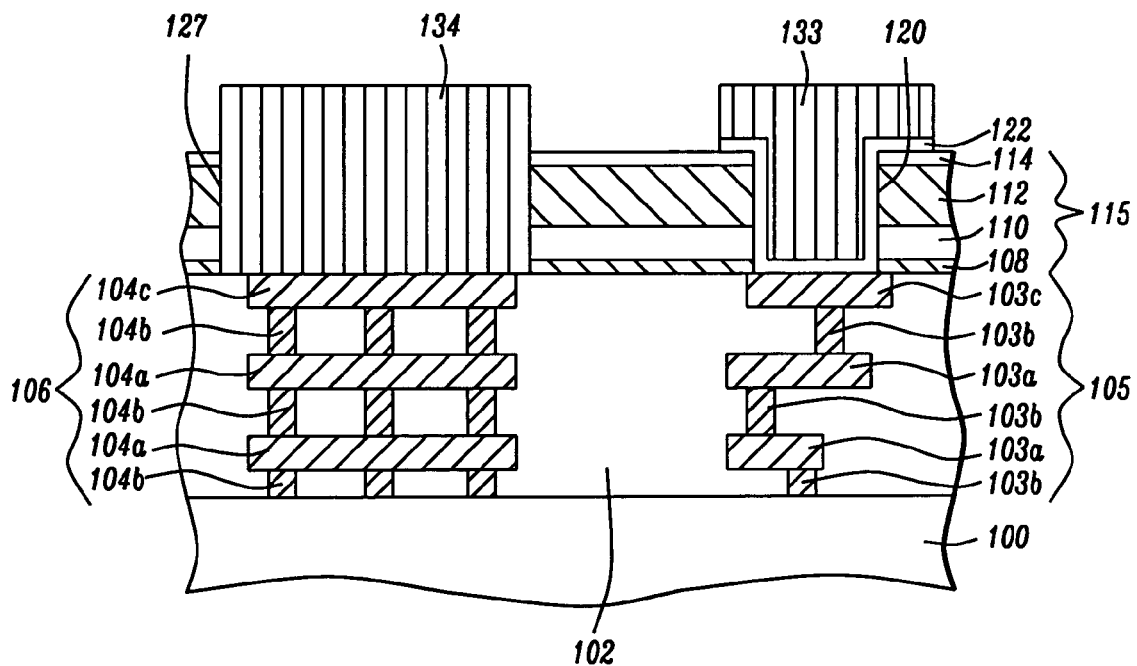

FIG. 12 shows the cross section after etching of the layer of metal, creating a metal interconnect aligned with the contact pad and an upper plate for the MIM capacitor.

DESCRIPTION OF THE PREFERRED EMBODIMENTS

The invention provides two embodiments, these two embodiments of the invention will be described in detail, using FIGS. 1 through 6 for the first embodiment of the invention and FIGS. 7 through 12 for the second embodiment of the invention.

Figure 1:
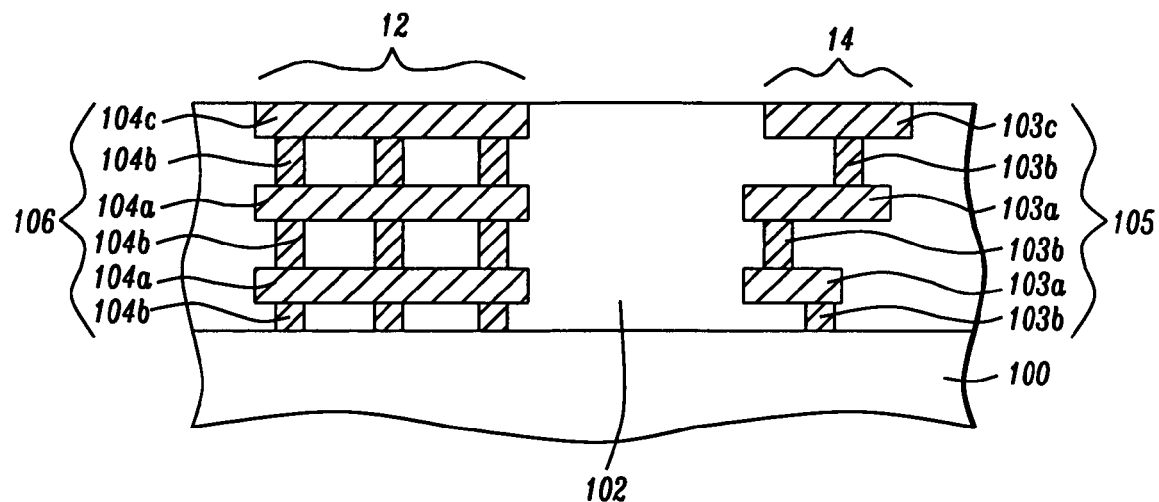
FIGS. 1 through 6 show the first embodiment of the invention, as follows.

Referring now specifically to FIG. 1, there is shown a cross section of a semiconductor substrate 100 over the surface of which have been defined contact pad area 12 and Metal-Insulator-Metal (MIM) capacitor area 14. A contact pad and an MIM capacitor are to be created aligned with areas 12 and 14 respectively.

The contact pad that is to be created aligned with the pad area 12 is connected to lower levels of metal, created in a layer 102 of insulating material, collectively highlighted in the cross section of FIG. 1 as interconnect metal 106, which comprises lower levels 104a of metal and a top level layer 104c, all levels of metal being connected by interconnect vias 104b. The top-level metal 104c serves as a contact pad.

The MIM capacitor that is to be created aligned with the capacitor area 14 is also supported by lower levels of metal, created in a layer 102 of insulating material, collectively highlighted in the cross section of FIG. 1 as interconnect metal 105, which comprises lower levels 103a of metal and a top level layer 103c, all levels of metal being connected by interconnect vias 103b. The top level 103c of metal serves as the lower plate of a thereover to be created MIM capacitor.

Figure 2:
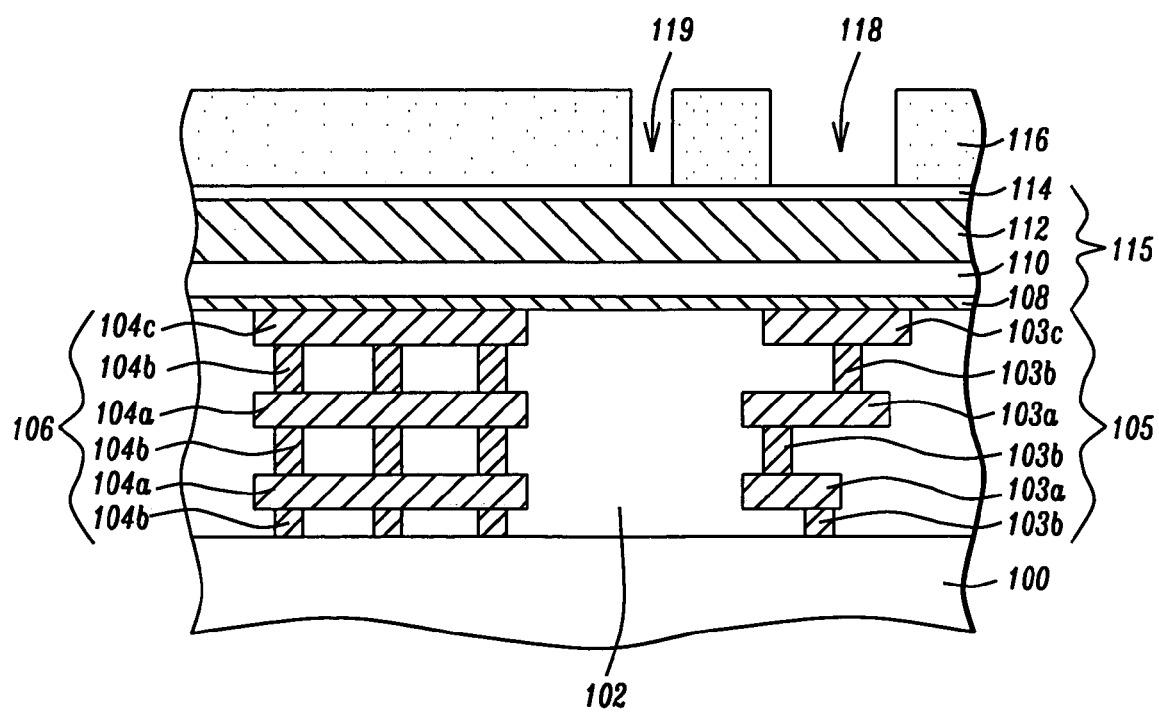

Deposited over layer 102 of insulating dielectric is, as shown in the cross section of FIG. 2, a layer 108 of etch stop material, preferably comprising Plasma Enhanced $Si_3N_4$, preferably deposited to a thickness of about 750 Angstrom.

Further shown in the cross section of FIG. 2 is a compound layer of passivation, comprising:

layer 110, of Plasma Enhanced Oxide (PEOX), preferably deposited to a thickness of about 4,000 Angstrom layer 112, of Plasma Enhanced $Si_3N_4$ ($PESi_3N_4$), preferably deposited to a thickness of about 6,000 Angstrom, and layer 114, of Plasma Enhanced oxide (PEOX), preferably deposited to a thickness of about 1,000 Angstrom.

The stack of layers 108, 110, 112 and 114 is collectively referred to as the compound layer 115 in the cross section shown in FIG. 2.

As a final layer shown in cross section in FIG. 2 is the first etch blocking mask 116, preferably comprising photoresist. Opening 119 created through the first etch blocking mask 116 is aligned with a fuse area to be created over substrate 100, the second opening 118 created through the first etch blocking mask 116 is aligned with the capacitor area 14 in the substrate 100.

Figure 3:
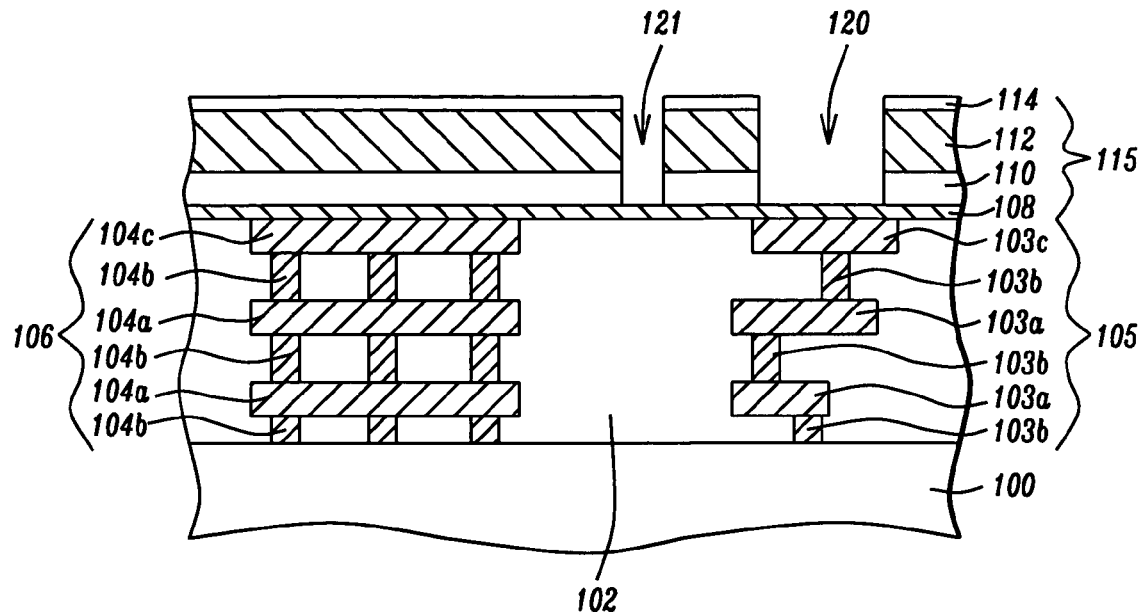

It is shown in the cross section of FIG. 3 that the compound layer of passivation, comprising layers 110 (of PEOX), 112 (of $PESi_3N_4$) and 114 (of PEOX), has been etched in accordance with the first etch blocking mask 116, creating openings 120 and 121 through the compound layer 110/112/114.

Opening 120 exposes the surface of the etch stop layer 108 where this layer 108 overlies the capacitor area 14, opening 121 exposes the surface of the etch stop layer 108 where this layer 108 overlies the fuse area of the substrate. Layer 108 of $Si_3N_4$ has served as the etch stop layer for the etch of the compound passivation layer shown in cross section in FIG. 3.

Layer 112 of silicon nitride is preferably used as a passivation layer due to its ability to provide an impermeable barrier to moisture and mobile impurities (e.g. sodium ions). Silicon nitride also forms a tough coating that protects an underlying integrated circuit against mechanical damage.

Layer 112 of silicon nitride can be deposited using PECVD technology at a temperature between about 350 and 450 degrees C. with a pressure of between about 2.0 and 2.8 Torr for the duration between about 8 and 12 seconds or a duration to create the preferred thickness of about 6,000 Angstrom for this layer.

The capacitor dielectric is exposed over a surface area by creating opening 120, which aligns with the MIM capacitor area 14, as shown in the cross section of FIG. 3. Simultaneous with the creation of opening 120, fuse opening 121 is created.

Figure 4:
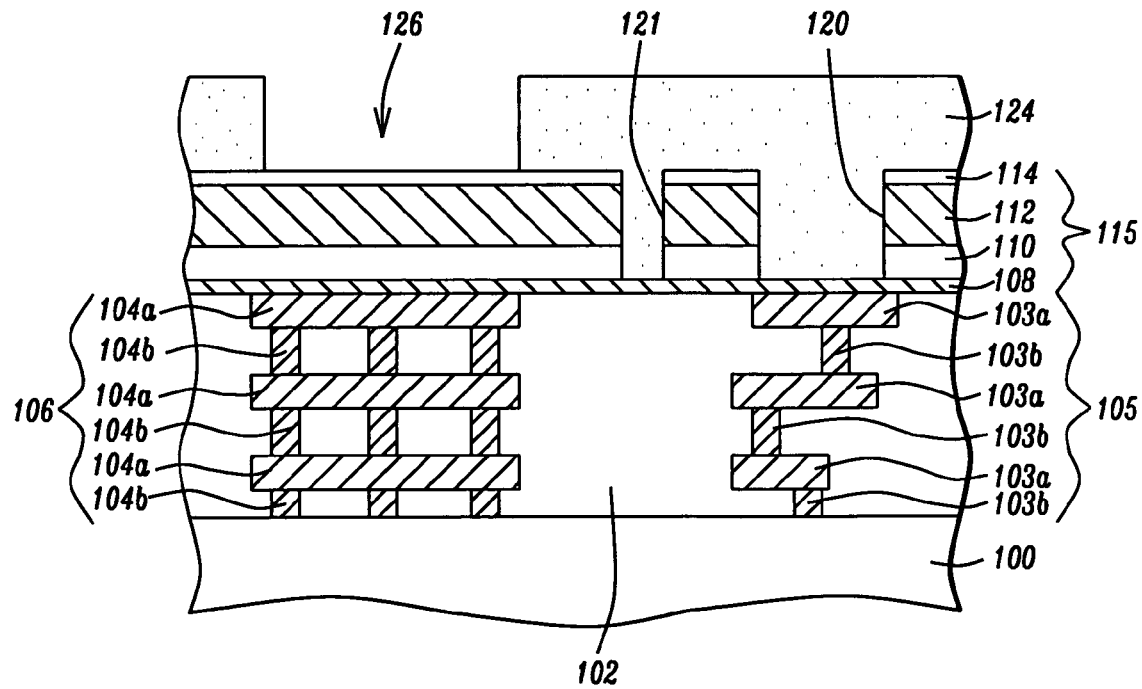

Next, the contact pad 12 is exposed by creating a second etch blocking mask 124, as shown in the cross section of FIG. 4, through which an opening 126 has been created overlying the contact pad area 12. The second etch blocking mask 124 covers the previously exposed capacitor dielectric (layer 108) and the fuse opening 121.

Figure 5:
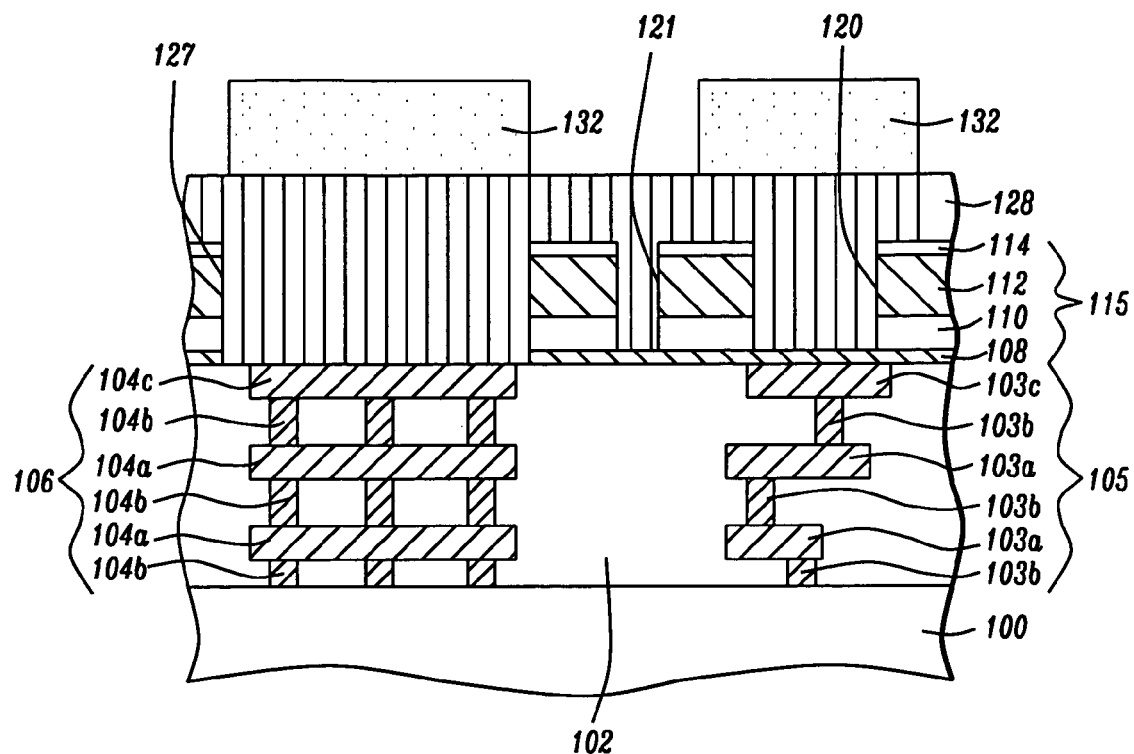

By now etching the compound passivation layer 110/112/114 in accordance with the second resist mask 124, the compound passivation layer 110/112/114 is removed from above the contact pad area 12 as shown in the cross section of FIG. 5. In addition, the etch stop layer 108 has been removed from the contact pad 104c. Also shown in the cross second of FIG. 5 are the steps that are required to create metal layers aligned with the contact pad area 12 and the capacitor area 14.

For this latter purpose layer 128, of metal such as for instance AlCu, is deposited over the substrate, filling openings 120, 121 and 126. This layer 128 is etched by creating the third etch blocking mask 132, shown in cross section in FIG. 5, whereby it will be noted that the third etch blocking mask 132 blocks the etch of layer 128 where this layer overlies the contact pad area 12 and the capacitor area 14.

Preferred deposition thickness for layer 128 of AlCu is a thickness of about 12,000 Angstrom. Conventional methods and processing conditions may be applied for the deposition of the layers 128 as well as for the creation of the third etch blocking mask 132.

Figure 6:
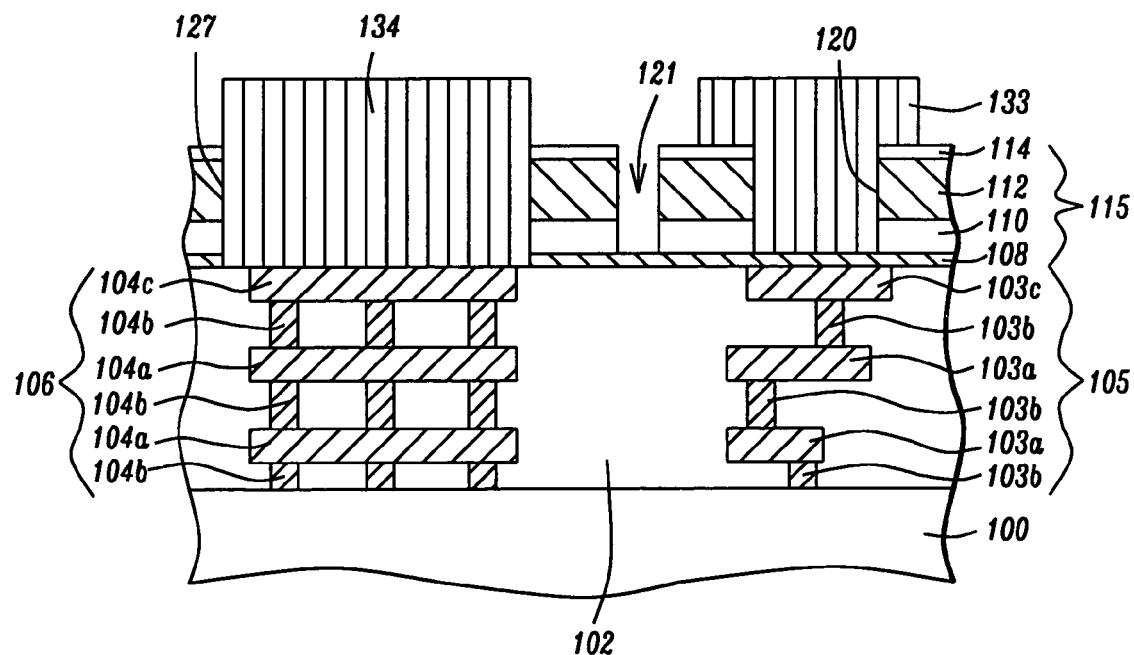

In the cross section of FIG. 6 it will be recognized that layer 128 has been etched in accordance with the third etch blocking mask 132, resulting in layers 134 of metal, such as AlCu, overlying the pad area 12 and layer 133 overlying the capacitor area 14 in addition to again opening the fuse opening 121.

In the cross section of FIG. 6 are shown a conductive interconnect 134, which is connected to contact pad 104c. Further shown is a MIM capacitor having a lower capacitor plate 103c, a capacitor dielectric 108 where layer 108 is present between the lower and the upper capacitor plate, and an upper capacitor plate 133.

The second embodiment of the invention is now described using FIGS. 7 through 12.

The second embodiment of the invention starts with the cross section that has previously been shown in FIG. 1 and which at this time is repeated as FIG. 7, whereon the various elements are identical to the elements as these have been explained above for FIG. 1.

Over the now familiar layer 108 of etch stop material and the compound passivation layer, comprising layers 110, 112 and 114, a fourth photoresist (P.R.) etch blocking mask 116 is created as shown in the cross section of FIG. 8. Opening 118, created through the P.R. etch blocking mask 116, overlies the capacitor area 14. The compound passivation layers 110, 112 and 114 are etched in accordance with the P.R. etch blocking mask 116 in addition to the etch stop layer 108, as shown in the cross section of FIG. 9. The lower capacitor plate 103C is now exposed.

The P.R. etch blocking mask 116 is removed after which a layer 122 of high-k dielectric, such as SiON, is deposited as shown in the cross section of FIG. 10. Layer 122 serves as capacitor dielectric. High dielectric constant material such as tantalum pentoxide ($TaO_5$), $Si_3N_4$ (7.4), $Al_2O_3$ (8.5), oxide-nitride-oxide (ONO) and $Si_2O$ can also be applied for layer 122.

A fifth P.R. etch blocking mask 124, as shown in the cross section of FIG. 10, is now created for the exposure of the contact pad 104c. Opening 127 through the P.R. etch blocking mask 124 overlies the contact pad area 12 in the substrate 100. Layer 122, of capacitor dielectric, and the compound layer of passivation, that is layers 114/112/110, are now etched in addition to the layer 108 of etch stop material, in accordance with the fifth P.R. etch blocking mask 124, exposing the contact pad 104c. After this etch has been completed, the fifth P.R. etch blocking mask 124 is removed.

FIG. 11 shows layer 128, of metal such as AlCu, deposited over the substrate, filling openings 120 and 127. This layer is etched by creating the sixth P.R. etch blocking mask 132, shown in cross section in FIG. 11, whereby it will be noted that the sixth P.R. etch blocking mask 132 blocks layers 122 and 128 where these layers overly the contact pad area 12 and the capacitor area 14.

Preferred deposition thickness for layer 128 of AlCu a thickness of about 12,000 Angstrom. Conventional methods and processing conditions may be applied for the deposition of the layer 128 as well as for the creation of the sixth P.R. etch blocking mask 132.

The result of the etching of layers 128, in accordance with the sixth P.R. etch blocking mask 132, is shown in the cross section of FIG. 12, where an AlCu contact pad 134 has been created over the contact pad 104c and a capacitor top plate 133 has been created over the capacitor dielectric 122 where this capacitor dielectric aligns with the lower capacitor plate 103c.

The flow for the first embodiment of the invention can be summarized as follows:

1. providing a substrate, a contact pad and a capacitor lower plate having been provided over the substrate in addition to a fuse area (FIG. 1), both the contact pad and the lower plate of the capacitor are connected to underlying layers of interconnect metal and interconnect vias
2. depositing a layer of etch stop and a compound layer of passivation, creating a first exposure mask for etching of the fuse and for exposing the capacitor dielectric where this capacitor dielectric aligns with the lower capacitor plate (FIG. 2)
3. etching the fuse area and exposing the capacitor dielectric where this capacitor dielectric aligns with the lower plate of the capacitor by creating openings through the compound passivation layer (FIG. 3)
4. exposing the contact pad (FIGS. 4 and 5)
5. depositing a layer of metal (FIG. 5), and
6. providing a contact pad interconnect and a capacitor upper plate by patterning and etching the layer of metal (FIG. 6).

The flow for the second embodiment of the invention can be summarized as follows:

1. providing a substrate, a contact pad and a capacitor lower plate having been provided over the substrate in addition to a fuse area, both the contact pad and the lower plate of the capacitor are connected to underlying levels of interconnect metal and interconnect vias (FIG. 7)
2. depositing a layer of etch stop and a compound layer of passivation; patterning the compound passivation layer and the etch stop layer for exposure of the lower capacitor plate, creating a fourth photoresist mask (FIG. 8)
3. exposing the capacitor lower plate by creating an opening through the compound passivation layer and the etch stop layer (FIG. 9)
4. depositing a layer of capacitor dielectric (FIG. 10)
5. exposing the pad area by creating an opening through the compound passivation layer and the layer of capacitor dielectric (FIGS. 10, 11)
6. depositing a layer of metal (FIG. 11)
7. providing a contact pad interconnect and a capacitor upper plate by patterning and etching the layer of metal (FIG. 12).

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A method of forming a MIM capacitor and a contact pad, comprising;
   providing a substrate having a metal contact pad and a metal capacitor lower plate disposed thereon;
   depositing a layer of etch stop material over the pad and plate;
   depositing a compound passivation layer over the etch stop layer,
   patterning the compound passivation layer and the layer of etch stop material;
   depositing a layer of capacitor dielectric over the patterned compound passivation layer so that the layer of capacitor dielectric directly overlies the metal capacitor lower plate;
   patterning the layer of capacitor dielectric, the compound passivation layer and the layer of etch stop material;
   depositing a layer of metal over the patterned layer of capacitor dielectric; and
   patterning the layer of metal.

2. The method of claim 1, wherein the steps of patterning the compound passivation layer and the layer of etch stop material comprises exposing the capacitor lower plate.

3. The method of claim 1, wherein the step of depositing a layer of capacitor dielectric over the compound passivation layer comprises depositing the layer of capacitor dielectric over inside surfaces of an opening created through the compound passivation layer and the layer of etch stop material.

4. The method of claim 1, wherein the step of patterning the layer of capacitor dielectric, the compound passivation layer and the layer of etch stop material exposes the contact pad.

5. The method of claim 1, wherein the step of depositing a layer of metal over the layer of capacitor dielectric comprises depositing the layer of metal over inside surfaces of openings created through the passivation layer.

6. The method of claim 1, wherein the step of patterning the layer of metal comprises creating a layer of metal aligned with the contact pad and capacitor lower plate.

7. The method of claim 1, the etch stop material comprising PESIN, deposited to a thickness of about 750 Angstrom.

8. The method of claim 1, the passivation layer comprising:
   a first layer of PEOX, deposited to a thickness of about 4,000 Angstrom;
   a second layer of PESiN deposited over the first layer of PEOX, deposited to a thickness of about 6,000 Angstrom; and
   a third layer of PEOX deposited over the second layer of PESiN, deposited to a thickness of about 1,000 Angstrom.

9. The method of claim 8, the first or lower layer of PEOX being deposited to a thickness of about 4,000 Angstrom.

10. The method of claim 8, the second or central layer of PESiN being deposited to a thickness of about 6.000 Angstrom.

11. The method of claim 8, the third or upper layer of PEOX being deposited to a thickness of about 1,000 Angstrom.

12. The method of claim 1, wherein the layer of metal is AlCu.

13. The method of claim 12, wherein the layer of AlCu has thickness of about 12,000 Angstrom.

14. A method of forming a MIM capacitor and a contact pad, comprising;
   providing a substrate;
   providing a contact pad and a capacitor lower plate over said substrate;
   depositing a layer of etch stop material over the contact pad and capacitor lower plate;
   depositing a compound passivation layer over the etch stop layer;
   patterning the compound passivation layer and the layer of etch stop material to expose at least a portion of the capacitor lower plate;
   depositing a layer of capacitor dielectric over the patterned compound passivation layer;
   patterning the layer of capacitor dielectric, the compound passivation layer and the layer of etch stop material;
   depositing a layer of metal over the patterned layer of capacitor dielectric; and
   patterning the layer of metal.

15. The method of claim 14, wherein the step of depositing a layer of capacitor dielectric comprises contacting said capacitor dielectric with the exposed portion of the capacitor lower plate.

16. The method of claim 14, wherein the step of depositing a layer of capacitor dielectric comprises depositing said capacitor dielectric over inside surfaces of an opening created through the compound passivation layer and the layer of etch stop material.

17. The method of claim 14, wherein the step of patterning the layer of capacitor dielectric, the compound passivation layer and the layer of etch stop material exposes the contact pad.

18. The method of claim 14, wherein the step of depositing a layer of metal over the layer of capacitor dielectric further comprises depositing the layer of metal over inside surfaces of openings created through the passivation layer.

19. The method of claim 14, wherein the step of depositing a layer of metal over the patterned layer of capacitor dielectric comprises creating a layer of metal aligned with the contact pad and capacitor upper plate.

20. A method of froming a MIM capacitor and a contact pad, comprising:
   providing a substrate having a contact pad and a capacitor lower plate;
   depositing an etch stop layer over the contact pad and capacitor lower plate;
   depositing a passivation layer over the etch stop layer;
   patterning the passivation layer and etch stop layer to expose at least a portion of the capacitor lower plate;
   depositing a layer of capacitor dielectric over the patterned compound passivation layer, said layer of capacitor dielectric contacting the exposed portion of the capacitor lower plate;
   patterning the layer of capacitor dielectric, the passivation layer and the layer of etch stop material to expose at least a portion of the contact pad;
   depositing a layer of metal over the patterned layer of capacitor dielectric; and
   patterning the layer of metal.

* * * * *

UNITED STATES PATENT AND TRADEMARK OFFICE
CERTIFICATE OF CORRECTION

PATENT NO. : 7,169,665 B2
APPLICATION NO. : 10/838674
DATED : January 30, 2007
INVENTOR(S) : Chuan Chang Lin and James Chiu It is certified that error appears in the above-identified patent and that said Letters Patent is hereby corrected as shown below:

Column 7, line 13, delete "PESIN" and insert therefore -- PESiN --.

Column 7, line 28, delete "6.000" and insert therefore -- 6,000 --.

Column 8, line 27, delete "froming" and insert therefore -- forming --.

Signed and Sealed this

Seventh Day of August, 2007

JON W. DUDAS
*Director of the United States Patent and Trademark Office*